(12) United States Patent
Uchikawa et al.

(10) Patent No.: US 6,531,661 B2
(45) Date of Patent: Mar. 11, 2003

(54) MULTILAYER PRINTED CIRCUIT BOARD AND METHOD OF MAKING THE SAME

(75) Inventors: Katsumi Uchikawa, Kawasaki (JP); Keiji Arai, Kawasaki (JP); Kazuhiko Iijima, Kawasaki (JP); Naoto Maezawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/880,037

(22) Filed: Jun. 14, 2001

(65) Prior Publication Data

US 2002/0108776 A1 Aug. 15, 2002

(30) Foreign Application Priority Data

Feb. 13, 2001 (JP) ........................................ 2001-035435

(51) Int. Cl.[7] .................................................. H05K 1/03
(52) U.S. Cl. ........................ 174/255; 174/262; 174/266; 174/264; 361/793
(58) Field of Search ................................. 174/255, 256, 174/262, 263, 264, 265, 266; 361/792, 793, 794, 795

(56) References Cited

U.S. PATENT DOCUMENTS

| | | | |
|---|---|---|---|
| 5,473,120 A | * 12/1995 | Ito et al. ........................ 174/255 |
| 5,527,998 A | * 6/1996 | Anderson et al. ............. 174/254 |
| 5,699,613 A | * 12/1997 | Chong et al. .................. 174/264 |
| 5,879,568 A | * 3/1999 | Urasaki et al. ................. 216/18 |
| 5,883,335 A | * 3/1999 | Mizumoto et al. ............ 174/266 |
| 6,294,741 B1 | * 9/2001 | Cole et al. ..................... 174/250 |
| 6,378,201 B1 | * 4/2002 | Tsukada et al. ............... 174/265 |

* cited by examiner

Primary Examiner—Albert W. Paladini
Assistant Examiner—Jose H. Alcalá
(74) Attorney, Agent, or Firm—Armstrong, Westerman & Hattori, LLP

(57) ABSTRACT

A multilayer printed circuit board is provided which includes a base member having a surface provided with a base wiring pattern, an inner buildup layer laminated on the base member and having a surface formed with an inner buildup wiring pattern, and an outer buildup layer laminated on the surface of the inner buildup layer and having a surface formed with an outer buildup wiring pattern. The wiring patterns are electrically connected to each other through vias. The inner buildup layer is formed of a resin material which is not reinforced by glass fibers, whereas the outer buildup layer is formed of a resin material reinforced by glass fibers.

7 Claims, 7 Drawing Sheets

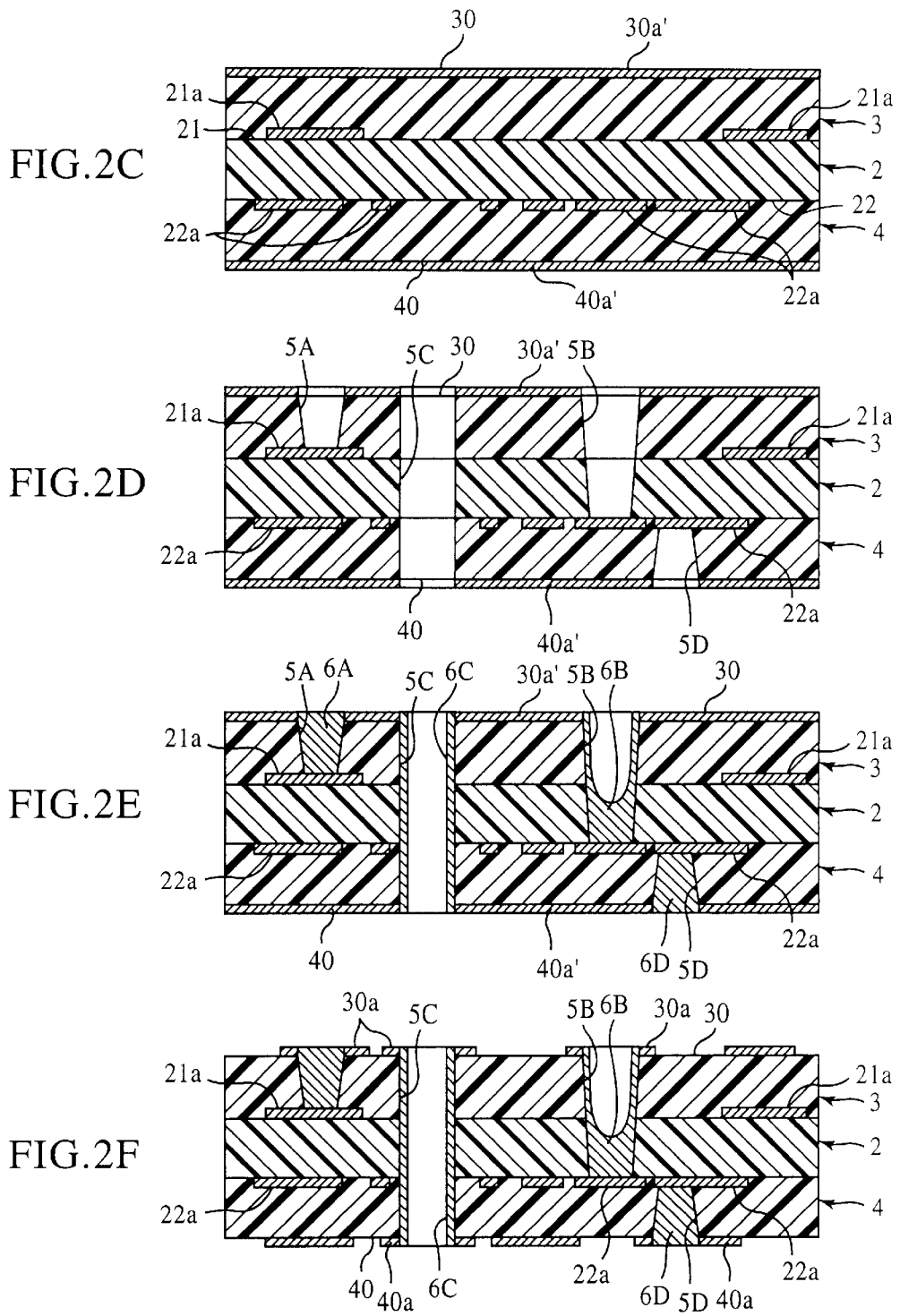

MULTILAYER PRINTED CIRCUIT BOARD AND METHOD OF MAKING THE SAME

BACKGROUND OF THE INVENTION

1. Field of the Invention

The present invention relates to a multilayer printed circuit board of the type which comprises a base member, at least one inner buildup layer formed on the base member, and an outer buildup layer formed on the inner buildup layer for mounting electronic components. The present invention also relates to a method of making such a multilayer printed circuit board.

2. Description of the Related Art

FIG. 3 illustrates an example of prior-art multilayer printed circuit board. The illustrated multilayer printed circuit board Y includes a core member 70 having a first surface 70A and a second surface 70B. The first surface 70A is formed with a first base wiring pattern 70a, whereas the second surface 70B is formed with a second base wiring pattern 70b. Two buildup layers 71, 73 are disposed on the first surface 70A, and other two buildup layers 72, 74 are disposed on the second surface 70B. Each of the buildup layers 71~74 as a surface 71A, 72A, 73A, 74A formed with a buildup wiring pattern 71a, 72a, 73a, 74a.

The base member 70 is formed with a via hole 8A in which conductor portion 9A is provided. The first base wiring pattern 70a and the second base wiring pattern 70b are electrically connected to each other through the conductor portion 9A. Similarly, the buildup layers 71~74 are formed with via holes 8B~8H respectively provided with conductor portions 9B~9H, through which the base wiring patterns 70a, 70b and the buildup wiring patterns 71a~74a are electrically connected. Various kinds of electronic components (not shown) may be mounted on the outermost buildup layers 73, 74 of the multilayer printed circuit board Y.

The above-described multilayer printed circuit board Y may be manufactured through the successive steps shown in FIGS. 4A~4L.

First, as shown in FIG. 4A, a base member 70 is prepared which has a first surface 70A and a second surface 70B respectively formed with conductor layers 70a', 70b' made of copper for example. Then, as shown in FIG. 4B, a via hole 8A is formed in the base member 70 by drilling for example. Subsequently, as shown in FIG. 4C, a conductor portion 9A is formed in the via hole 8A by electroless plating for example. After that, the conductor layers 70a', 70b' are subjected to etching, thereby providing base wiring patterns 70a, 70b, as shown in FIG. 4D.

Then, as shown in FIG. 4E, buildup layers 71, 72 each having a surface 71A, 72A formed with a conductor layer 71a', 72a', are bonded to the first and the second surfaces 70A, 70B of the core member 70, respectively. Subsequently, in a manner similar to the foregoing, via holes 8B, 8C, 8D are formed as shown in FIG. 4F, conductor portion 9B, 9C, 9D are formed as shown in FIG. 4G, and buildup wiring pattern 71a, 72a are formed as shown in FIG. 4H. Thus, buildup wiring patterns 71a, 72a and the base wiring patterns 70a, 70b are electrically connected through the conductor portions 9B~9D. Then, similarly to the above, buildup layers 73, 74 are laminated, and via holes 8E, 8F, 8G, 8H, conductor portions 9E, 9F 9G, 9H, and buildup wiring pattern 73a, 74a are formed, as shown in FIGS. 4I~4L.

In the above-described multilayer printed circuit board Y, all of the buildup layers 71~74 are formed of a same material. For example, for providing a light multilayer printed circuit board Y, the buildup layers 71~74 maybe formed of a resin coated copper foil (RCC foil). On the other hand, for providing a multilayer printed circuit board Y having a high rigidity (flexural rigidity), the buildup layers 71~74 may be formed of a resin reinforced by a glass fiber such as a glass epoxy resin.

However, since the light multilayer printed circuit board Y formed of a RCC foil does not have a sufficient rigidity, it may warp when electronic components are mounted on the buildup wiring patterns 73a, 74a. Thus, it may be impossible to appropriately mount electronic components on such a light multilayer printed circuit board Y.

On the other hand, the rigid multilayer printed circuit board Y formed of a resin reinforced by a glass fiber has a disadvantageously large weight. Further, it is difficult to form via holes 8A~8H by laser beam application in such a rigid multilayer printed circuit board.

Moreover, the via holes 8A~8H formed by laser beam application generally have a diameter of 30~200 $\mu$m, and it is difficult to fill the via holes with the conductive material by electroless plating in forming the conductor portions 9A~9H. Therefore, the buildup wiring patterns 73a, 74a include recesses at the via holes 8E~8H where electronic components cannot be mounted. As a result, there exists a great limitation on the mounting positions of electronic components. To solve this problem, the via holes need to be filled with a conductor paste for example, which is troublesome. Further, the mounting of electronic components on the via holes filled with a conductor paste is not preferable in view of the conduction reliability of the electronic components.

SUMMARY OF THE INVENTION

It is therefore an object of the present invention to provide a light but yet rigid multilayer printed circuit board on which electronic components can be appropriately mounted.

Another object of the present invention is to provide a multilayer printed circuit board which can be made at a relatively low cost.

A further object of the present invention is to provide a method for conveniently making such a multilayer printed circuit board.

In accordance with a first aspect of the present invention, there is provided a multilayer printed circuit board comprising: a base member provided with a base wiring pattern formed on at least one surface thereof; at least one inner buildup layer laminated on said at least one surface of the base member and having a surface formed with an inner buildup wiring pattern, the inner buildup wiring pattern being electrically connected to the base wiring pattern through at least one via formed in said at least one inner buildup layer; and an outer buildup layer laminated on said surface of said at least one inner buildup layer and having a surface formed with an outer buildup wiring pattern, the outer buildup wiring pattern being electrically connected to the inner wiring pattern through at least one via formed in the outer buildup layer; wherein said at least one inner buildup layer is made of a resin material which is not reinforced by glass fibers, the outer buildup layer being made of a resin material reinforced by glass fibers.

With such a structure, the multilayer printed circuit board has a high rigidity and is unlikely to warp because the outer buildup layer is formed of a resin material reinforced by glass fibers. As a result, it is possible to appropriately mount electronic components on the board.

On the other hand, the inner buildup layer is formed of a resin material which is not reinforced by glass fibers. Therefore, it is possible to realize a weight reduction of the multilayer printed circuit board as a whole.

In the above-described structure, two or more inner buildup layers may be interposed between the outer buildup layer and the base member. In such a case, at least one of the inner buildup layers needs to be made of a resin material which is not reinforced by glass fibers, though it is more preferable if all of the inner buildup layers are made of such a material.

Preferably, the inner buildup layer may be made of a thermosetting resin such as phenolic resin, epoxy resin or polyimide resin. On the other hand, the outer buildup layer may be formed of a resin material obtained by reinforcing the above-described thermosetting resin by glass fibers. The glass fibers may be in the form of a plain-woven glass cloth or a nonwoven fabric.

The base member may be made of any insulating material. However, similarly to the inner buildup layer, the base member is preferably made of a resin material which is not reinforced by glass fibers for effectively reducing the weight of the multilayer printed circuit board.

The base wiring pattern and each of the buildup wiring patterns may be provided by forming a conductor layer on the base member or each buildup layer, forming thereon a mask, and partially etching away the conductor material. The conductor layer is formed by attaching a metal foil such as a copper foil onto the base member or each buildup layer, or by growing a metal film by plating or vapor deposition.

Each via hole may be made by drilling, laser beam application, plasma etching or photolithography to have an inner diameter of 30~200 $\mu$m for example.

In the case where the via hole is to be formed by laser beam application, it is preferable that the outer buildup layer be formed of a glass fiber cloth prepreg obtained by impregnating open glass fiber cloth with a thermosetting resin. An open glass fiber cloth has a smaller fiber density at the crossing points of warps and wefts than an ordinary glass fiber cloth. Therefore, it is possible to make a hole even at the crossing points of warps and wefts by laser beam application, as opposed to an ordinary glass fiber cloth wherein it is difficult to form a hole at the crossing points of warps and wefts where the fiber density is very high.

Preferably, the multilayer printed circuit board may further comprises: an additional base wiring pattern formed on another surface of the base member; at least one additional inner buildup layer laminated on said another surface of the base member and having a surface formed with an additional inner buildup wiring pattern, the additional inner buildup wiring pattern being electrically connected to the additional base wiring pattern through at least one via formed in said at least one additional inner buildup layer; and an additional outer buildup layer laminated on said surface of said at least one additional inner buildup layer and having a surface formed with an additional outer buildup wiring pattern, the additional outer buildup wiring pattern being electrically connected to the additional inner wiring pattern through at least one via formed in the additional outer buildup layer; wherein said at least one additional inner buildup layer is made of a resin material which is not reinforced by glass fibers, the additional outer buildup layer being made of a resin material reinforced by glass fibers.

With such a structure, since the base member and the inner buildup layers (including the additional inner buildup layer or layers) are sandwiched between both outer buildup layers, the multilayer printed circuit board can enjoy a further enhanced rigidity. Since both of the two outer layers have a high rigidity, it is possible to prevent the multilayer printed circuit board from warping in any direction.

Preferably, the or each via of the or each inner buildup layer may comprise a filled via.

Further, the or each via of the or each outer buildup layer may comprise a filled via.

Preferably, the or each via of the or each inner buildup layer may comprise a filled via, while the or each via of the or each outer buildup layer may also comprise a filled via which is stacked on the filled via of the or each inner buildup layer.

Preferably, the base member may have another surface formed with an additional base wiring pattern, and the or each via of the or each inner buildup layer comprises a skip via penetrating through the or each inner buildup layer and the base member into electrical connection with the additional base wiring pattern.

According to a second aspect of the present invention, there is provided a method of making a multilayer printed circuit board, the circuit board comprising: a base member provided with a base wiring pattern formed on at least one surface thereof; at least one inner buildup layer laminated on said at least one surface of the base member and having a surface formed with an inner buildup wiring pattern, the inner buildup wiring pattern being electrically connected to the base wiring pattern through at least one via formed in said at least one inner buildup layer; and an outer buildup layer laminated on said surface of said at least one inner buildup layer and having a surface formed with an outer buildup wiring pattern, the outer buildup wiring pattern being electrically connected to the inner wiring pattern through at least one via formed in the outer buildup layer; said at least one inner buildup layer is made of a resin material which is not reinforced by glass fibers, the outer buildup layer being made of a resin material reinforced by glass fibers; wherein said at least one via of of said at least one inner buildup layer and said at least one via of the outer buildup layer is formed by the steps of: forming a via hole by laser beam application; and depositing a conductive substance in the via hole:

The deposition of the conductive substance may be performed by plating the inner surface of the via hole. Though electroless plating is generally used, pulse plating is preferable.

In pulse plating, positive and negative potentials are alternately applied to an object to be plated. When positive potential is applied, a metal film grows, whereas the metal film is partially removed when negative potential is applied. The amount of film growth is larger on a rough surface than on a smooth surface, whereas the amount of film removal is larger on a smooth surface than on a rough surface. Therefore, pulse plating makes it possible to form a metal film intensively on a rough surface. Since the inner surface of the via hole made by laser beam application is generally rough, it is possible to intensively plate the inner surface of the via hole by utilizing pulse plating. Thus, when a via hole has an inner diameter of 30~200 $\mu$m and a depth of 0.05~0.5 mm for example, it is possible to fill the via hole with a conductive substance by pulse plating, thereby providing a filled via.

In this way, the via hole formed in the outer buildup layer can be filled by pulse plating without the need for performing an additional troublesome step for filling the via hole with a conductor paste for example. Therefore, it is possible to mount an electronic component even on the via hole with a connection reliability. As a result, an electronic component may be mounted at any portion of the wiring pattern. 11. The method according to claim 8, wherein the via hole has a diameter of 30~200 μm.

Preferably, the outer buildup layer may be formed by laminating a prepreg of a glass-fiber-reinforce thermosetting resin on the inner buildup layer and then heating the prepreg.

Other features and advantages of the present invention will become clearer from the detailed description give below with reference to the accompanying drawings.

BRIEF DESCRIPTION OF THE DRAWINGS

FIG. 1 is a sectional view showing an example of a multilayer printed circuit board in accordance with the present invention.

FIGS. 2A through 2J are sectional views showing the successive steps for manufacturing the multilayer printed circuit board shown in FIG. 1.

DETAILED DESCRIPTION OF THE PREFERRED EMBODIMENT

A preferred embodiment of the present invention will be described below in detail with reference to the accompanying drawings.

Figures 1, 2A, 2B:
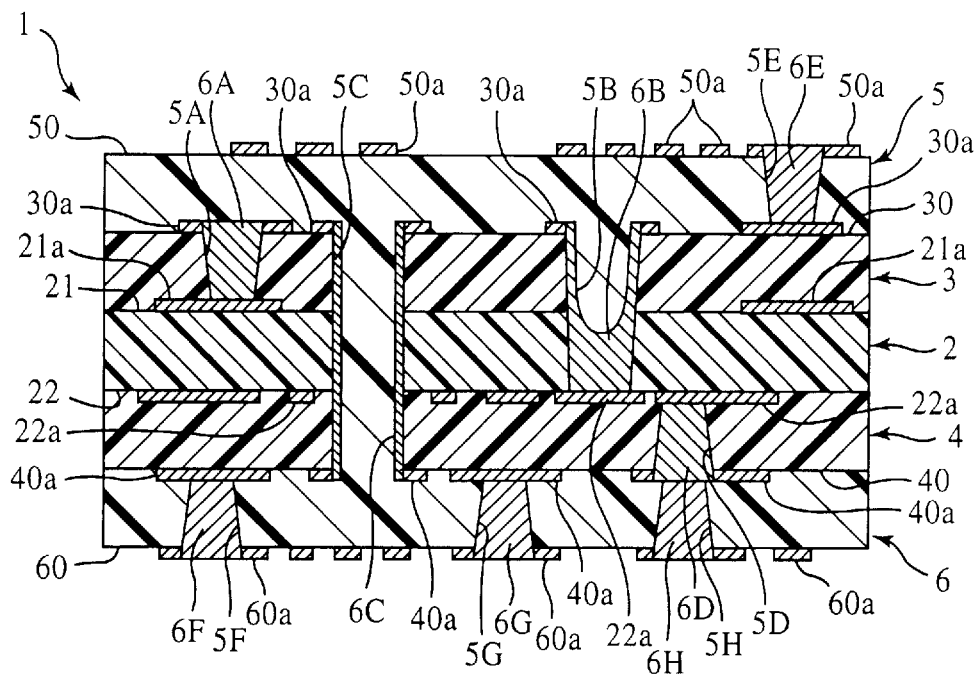

FIG. 1 is a sectional view showing a multilayer printed circuit board embodying the present invention.

The illustrated multilayer printed circuit board 1 includes a core member or plate (base member or plate) 2 having a first surface 21 and a second surface 22 formed with base wiring patterns 21a, 22a, respectively. Inner buildup layers 3, 4 are disposed on the first and the second surfaces 21, 22 of the core member 2, respectively. The inner buildup layers 3, 4 are formed of a resin which is not reinforced by glass fibers. Each of the inner buildup layers 3, 4 has an outwardly directed surface 30, 40 formed with an inner buildup wiring pattern 30a, 40a.

The inner buildup wiring pattern 30a is electrically connected to the base wiring pattern 21a through a conductor portion 6A provided in each of via holes 5A (only one shown) The inner buildup wiring pattern 30a is also electrically connected to the base wiring pattern 22a through a conductor portion 6B provided in each of via holes 5B (only one shown) Further, the inner buildup wiring pattern 30a is electrically connected to the buildup wiring pattern 40a through a conductor portion 6C provided in each of via holes 5C (only one shown). The inner buildup wiring pattern 40a is also connected electrically to the wiring pattern 22a of the core member 2 through a conductor portion 6D provided in each of via holes 5D (only one shown).

The via hole 5A is a filled via which is filled with a conductive material. The via hole 5B is a skip via which skip the base wiring pattern 21a (head side base wiring pattern) for directly connecting the other base wiring pattern 22a (tail side base wiring pattern) to the inner buildup wiring pattern 30a. The via hole 5C is a buried via hole (BVH) penetrating through the core member 2.

Outer buildup layers 5, 6 (more accurately outermost layers) are formed respectively on the outwardly directed surfaces 30, 40 of the inner buildup layers 3, 4. The outer buildup layers 5, 6 are made of a composite resin material obtained by impregnating an open glass fiber cloth with an epoxy resin for example. Therefore, the outer buildup layers 5, 6 have a greater rigidity than the inner buildup layers 3, 4. The outer buildup layers 5, 6 have respective outwardly directed surfaces 50, 60 formed with outer buildup wiring patterns 50a, 60a, respectively.

The outer buildup wiring pattern 50a is electrically connected to the inner buildup wiring pattern 30a through a conductor portion 6E filled in each of via holes 5E (only one shown). The outer buildup wiring pattern 60a is electrically connected to the inner buildup wiring pattern 40a through conductor portions 6F, 6G, 6H filled in via holes 5F, 5G, 5H, respectively. The via hole 5H is formed directly under the via hole 5D (as viewed in FIG. 5) formed in the inner buildup layer 4 so that the via holes 5D, 5H respectively filled with conductor portions 6D, 6H constitute a stack via.

Next, a method of making the above-described multilayer printed circuit board 1 is described with reference to FIGS. 2A through 2J.

First, as shown in FIG. 2A, a core member 2 is prepared having a first surface 21 and a second surface 22 on which conductor layers 21a', 22a' are respectively formed. The core member 2 may be made of an epoxy resin which is not reinforced by a glass fiber. Preferably, the core member 2 has a lower specific gravity than the outer buildup layers 5, 6 to be described later. Each of the conductor layers 21a', 22a' may be formed by attaching a metal foil such as a copper foil onto the core member 2 or by growing a metal film, in situ, on the core member 2 by plating or vapor deposition.

Then, as shown in FIG. 2B, the conductor layers 21a', 22a' are subjected to an etching process for providing base wiring patterns 21a, 22a, respectively. Specifically, a photoresist layer (not shown) is first formed on each of the conductor layers 21a', 22a' and then etched by known photolithography to provide a mask (not shown) having a predetermined pattern of openings and cutouts. Subsequently, utilizing the thus formed mask, each of the conductor layers 21a', 22a' is subjected to an etching process by which the conductor material of the conductor layer 21a' or 22a' is removed by an etchant at the openings and cutouts of the mask. Finally, the mask is removed away by a suitable solvent, consequently leaving the base wiring pattern 21a or 22a.

Then, as shown in FIG. 2C, inner buildup layers 3, 4 are laminated on the first and the second surfaces 21, 22 of the core member 2, respectively. The inner buildup layers 3, 4 provide respective surfaces 30, 40 formed with respective conductor layers 30a', 40a'. Each of the inner buildup layers 3, 4 is made of a material, such as an epoxy resin, which is not reinforced by glass fibers. Similarly to the conductor layer 21a' or 22a', the conductor layer 30a' or 40a' may be formed by plating or vapor deposition. The conductor layer 30a' or 40a' may be provided in advance before the inner buildup layer 3 or 4 is laminated on the core member 2 or may be provided after the inner buildup layer 3 or 4 is laminated on the core member 2.

Then, as shown in FIG. 2D, via holes 5A, 5B, 5C, 5D are formed. The via hole 5A may be formed by applying a laser beam from the side of the surface 30 of the inner buildup layer 3 so as to penetrate through the inner buildup layer 3 only. The via hole 5B may be formed by applying a laser beam from the side of the surface 30 of the inner buildup layer 3 so as to penetrate through the inner buildup layer 3 and the core member 2. The via hole 5C may be formed by drilling from the side of the surface 30 of the inner buildup layer 3 so as to penetrate through the inner buildup layers 3, 4 and the core member 2. The via hole 5D may be formed by applying laser from the side of the surface 40 of the inner buildup layer 4 so as to penetrate through the inner buildup layer 4 only. When the core member 2 and the inner buildup layers 3, 4 are thin, the via hole 5c may also be formed by applying a laser beam. Each of the via holes 5A~5D may have a diameter of 30~200 μm for example.

Subsequently, as shown in FIG. 2E, conductor portions 6A, 6B, 6C, 6D are formed in the via holes 5A~5D, respectively. As a result, electrical conduction is established between the conductor layer 30a' and each of the respective base wiring patterns 21a, 22a, between the conductor layer 40a' and the base wiring pattern 22a, and between the conductor layer 30a' and the conductor layer 40a'.

The conductor portions 6A~6d are simultaneously formed by pulse plating for example. Since the via holes 5A~5D are formed by applying a laser beam or by drilling as described above, the inner surfaces of these via holes are rougher than the surfaces of the conductor layers 30a', 40a' formed by plating or vapor deposition. Therefore, pulse plating causes a conductive substance (contained in the electrolyte for plating) to grow intensively in the via holes so that the relatively shallow via holes 5A, 5D are filled with the conductive substance to provide filled vias.

In the process steps shown in FIGS. 2D and 2E, the core member 2 is perforated at the same time as the inner buildup layers 3, 4. Further, the conductor portions for the core member 2 are formed at the same time as the conductor portions for the inner buildup layers 3, 4. In other words, the perforating step and the conductor-plating step need not be performed solely for the core plate 2. Therefore, it is possible to make the multilayer printed circuit board through a decreased number of steps, which is cost-efficient.

Then, as shown in FIG. 2F, the conductor layers 30a', 40a' are subjected to an etching process (which is similar to the etching process for the formation of the base wiring patterns 21a, 22a) for providing inner buildup wiring patterns 30a, 40a. The inner buildup wiring patterns 30a, 40a thus provided are appropriately connected to the base wiring patterns 21a, 22a, respectively, and to each other.

Figure 2G:
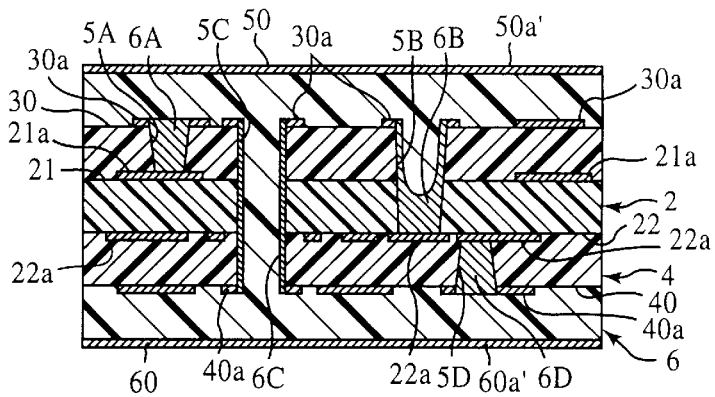

Then, as shown in FIG. 2G, outer buildup layers 5, 6 are laminated on the inner buildup layers 3, 4, respectively. The outer buildup layers 5, 6 provide respective surface s50, 60 formed with respective conductor layers 50a', 60a'. Each of the outer buildup layers 5, 6 has a higher rigidity than the inner buildup layers 3, 4. For this purpose, the outer buildup layer 5 ir 6 may be made of e.g. a prepreg prepared by impregnating an open glass fiber cloth with an epoxy resin (an example of a thermosetting resin).

Specifically, such a prepreg may be laminated on each of the inner buildup layers 3, 4, and then heated for hardening the thermosetting resin component contained in the prepreg. During the above-described process step, the thermosetting resin component of the prepreg enters, before hardening, into the via holes 5B, 5C and then hardens under heating. As a result, the outer buildup layer 5 or 6 is strongly bonded to the inner buildup layer 3 or 4 due to an anchoring effect.

The conductor layers 50a', 60a' may be also formed by plating or vapor deposition. The conductor layers 50a', 60a' may be provided in advance before the outer buildup layers 5, 6 are disposed on the inner buildup layers 3, 4 or may be provided after the outer buildup layers 5, 6 are laminated on the inner buildup layers 3, 4.

Figure 2H:
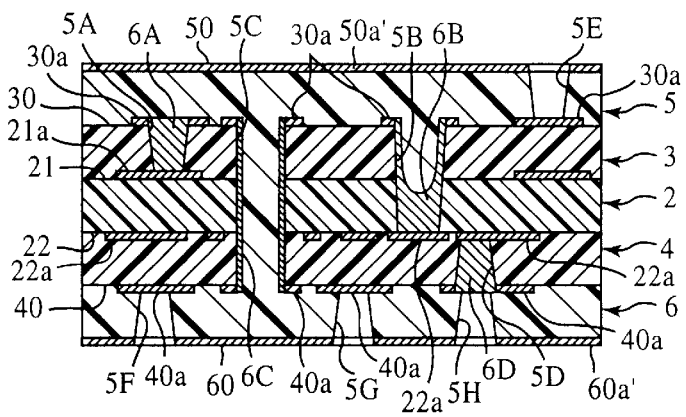

Then, as shown in FIG. 2H, via holes 5E, 5F, 5G, 5H are formed so as to penetrate either one of the outer buildup layers 5, 6 only. The via holes 5E~5H may be formed by applying a laser beam from the side of the surface 50 or 60 of the outer buildup layer 5 or 6. The via hole 5H is formed directly under the via hole 5D (as viewed in the drawings) formed in the inner buildup layer 4. Each of the via holes 5E~5G has a diameter of 30~200 μm for example, similarly to the via holes 5A~5D.

Figure 2I:
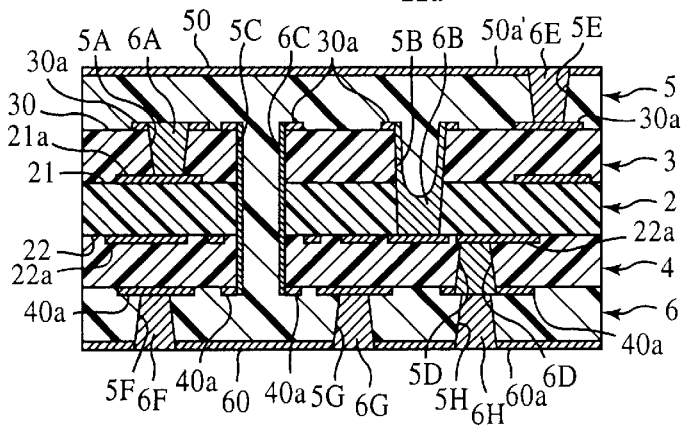

Then, as shown in FIG. 2I, conductor portions 6E, 6F, 6G, 6H are provided in the via holes 5E~5H, respectively. As a result, electrical conduction is provided between the conductor layer 50a, or 60a' and the inner buildup wiring pattern 30a or 40a, respectively.

Figure 2J:
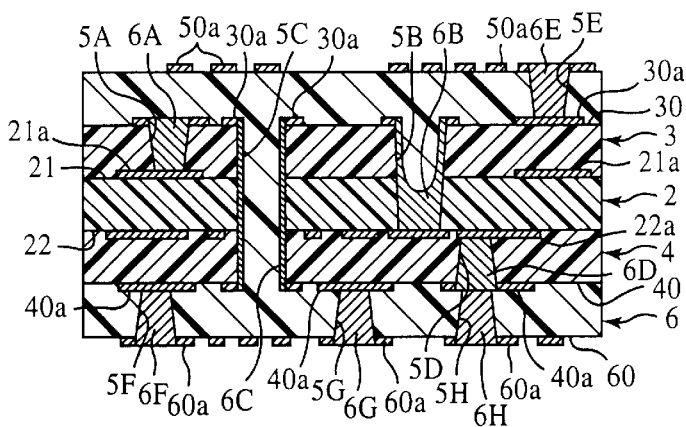
Figure 3:
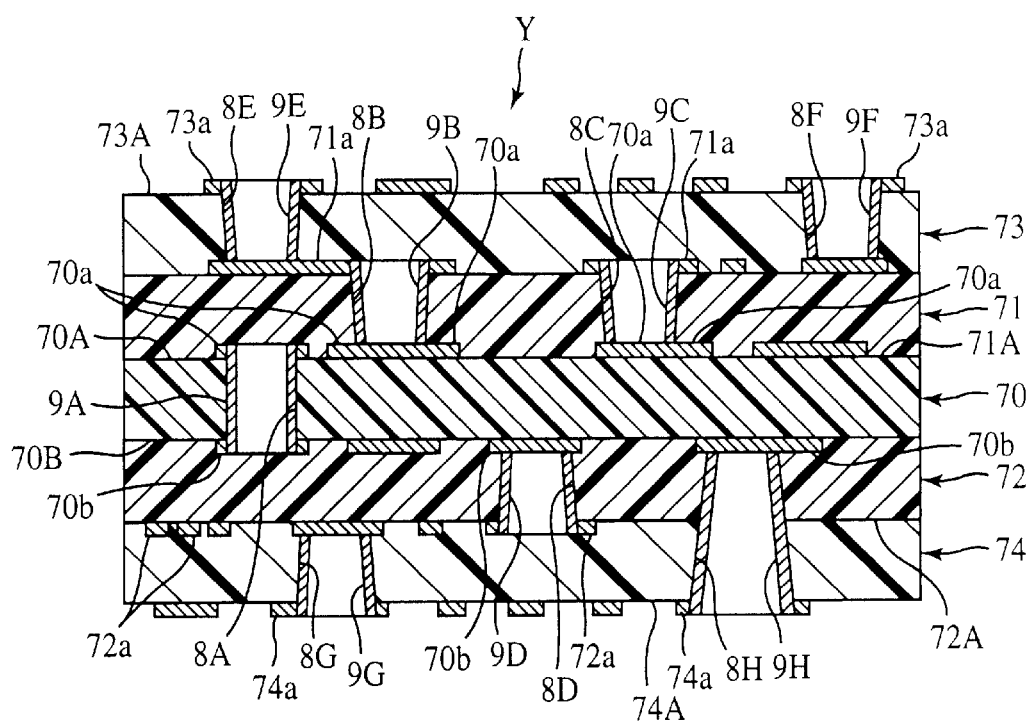
FIG. 3 is a sectional view showing a prior art multilayer printed circuit board.
Figure 4A:
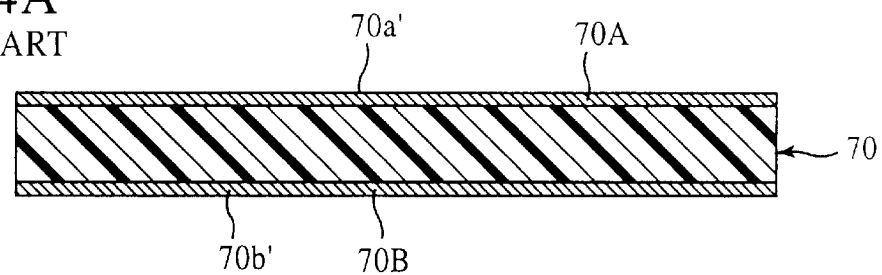
FIGS. 4A through 4L are sectional views showing the successive steps for manufacturing the multilayer printed circuit board shown in FIG. 3.
Figure 4B:
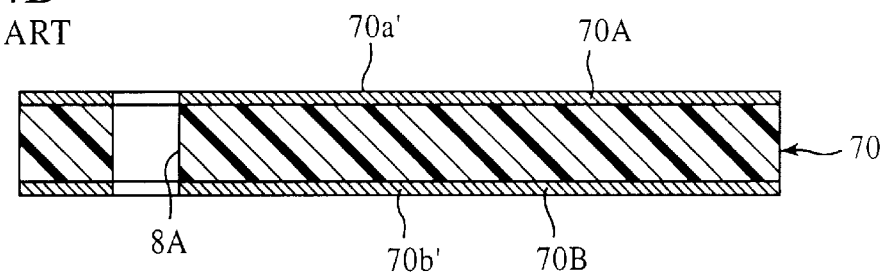
Figure 4C:
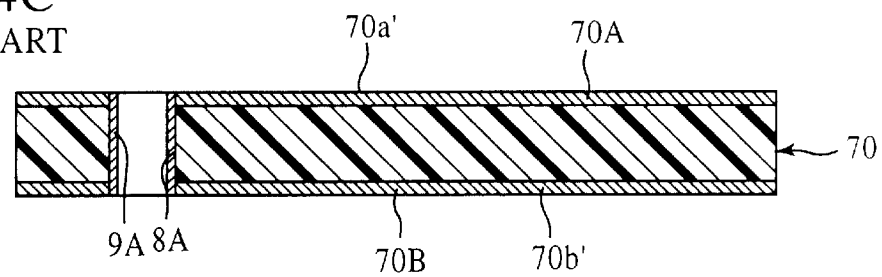
Figure 4D:
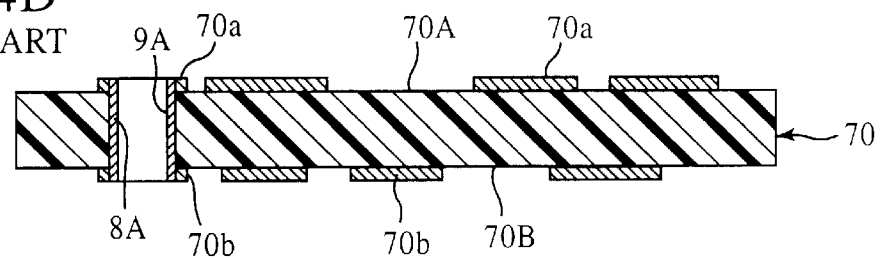
Figure 4E:
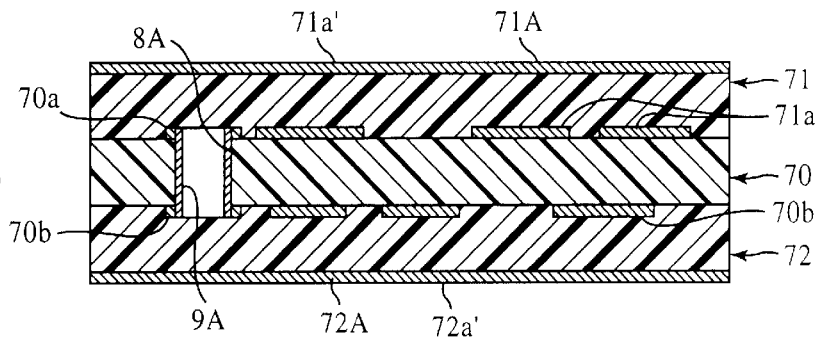
Figure 4F:
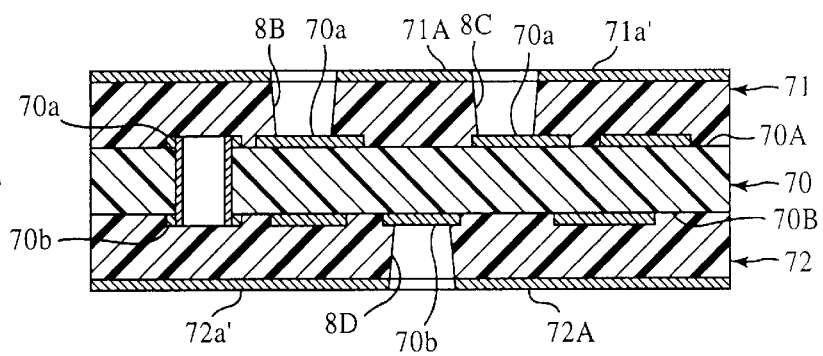
Figure 4G:
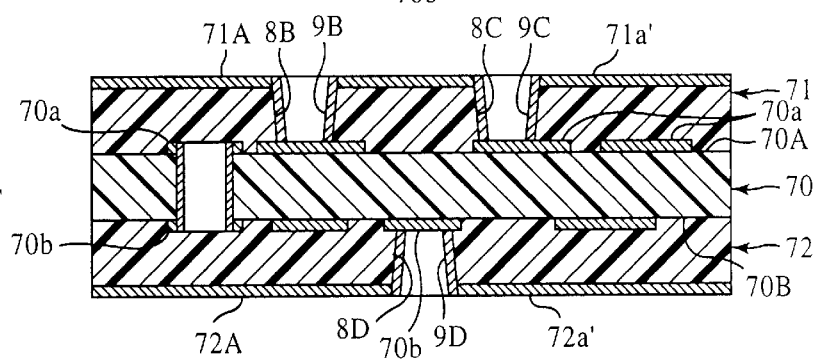
Figure 4H:
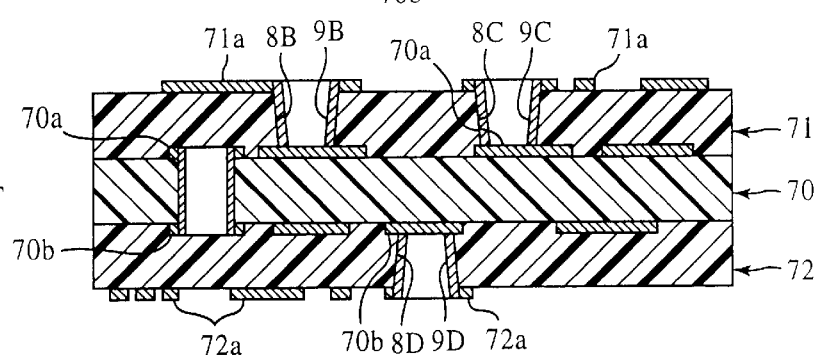
Figure 4I:
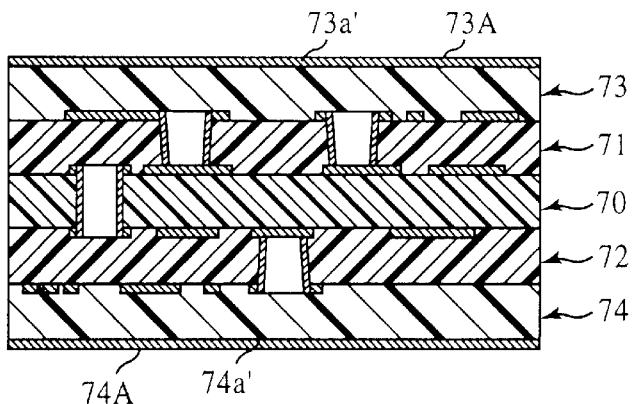
Figure 4J:
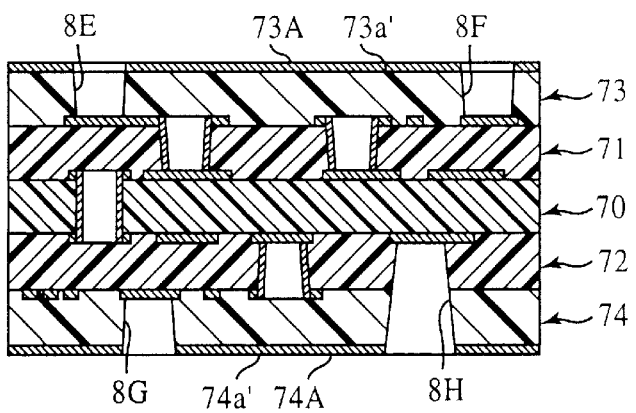
Figure 4K:
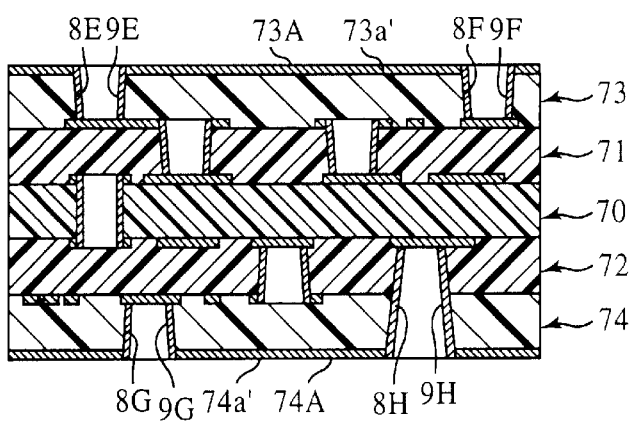
Figure 4L:
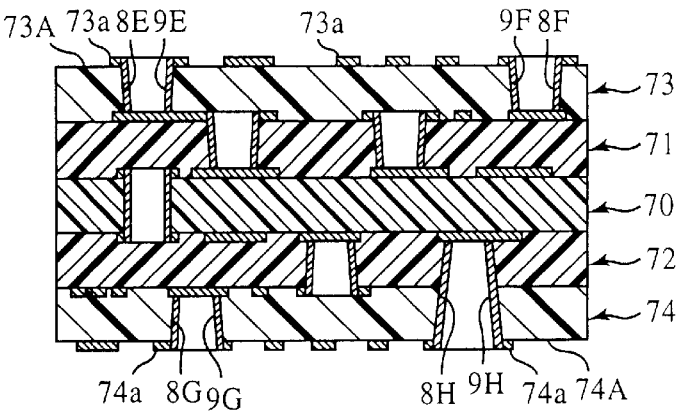

Then, as shown in FIG. 2J, the conductor layers 50a' 60a' are subjected to an etching process (which is similar to the etching process for the formation of the base wiring patterns 21a, 22a) for providing outer buildup wiring patterns 50a, 60a. The buildup wiring patterns 50a, 60a thus provided are appropriately connected to the inner buildup wiring patterns 30a, 40a, respectively.

In the multilayer printed circuit board 1 thus manufactured, the outer buildup layers 5, 6 which are the outermost layers of the lamination are more rigid and stronger than the inner buildup layers 3, 4. On the other hand, the inner buildup layers 3, 4 are formed of a material which is not reinforced by e.g. a glass fiber cloth and have a lower specific gravity than the outer buildup layers 5, 6. Therefore, the multilayer printed circuit board 1 has a high rigidity (flexural rigidity) owing to the rigid outer buildup layers 5, 6 while at the same time having a relatively small weight owing to the inner buildup layers 3, 4.

It is now supposed that the core member and the inner buildup layers are formed of a resin coated copper foil, whereas the outer buildup layers are formed of an epoxy resin reinforced by an open glass fiber cloth, in accordance with the present invention. Such a multilayer printed circuit board has a bending strength which is higher by about 40% than a conventional multilayer printed circuit board in which all of the core member and the buildup layers are formed of a resin coated copper foil, provided that conditions other than the material for the outer buildup layers are the same.

Particularly, in the above-described multilayer printed circuit board 1, the relatively rigid buildup layers 5, 6 are the outermost layers of the board so that the multilayer printed circuit board 1 is unlikely to warp. Therefore, it is possible to appropriately mount electronic components onto the multilayer printed circuit board 1.

Moreover, as a result of forming the conductive portions 6E~6H by pulse plating, the via holes 5E~5H of the outer buildup layers 5, 6 become filled vias. Therefore, it is not necessary to perform an additional step for filling the via holes 5E~5H with a conductive paste for example after forming the conductor portions 6E~6H by pulse plating. Therefore, even without such an additional step, it is possible to appropriately mount electronic components at the filled vias 6E~6H of the buildup wiring patterns 50a, 60a, thereby increasing the mounting density of electronic components on the board due to less limitation on the mounting positions.

In the illustrated embodiment, the buildup layers including the inner buildup layers 3, 4 and the outer buildup layers 5, 6 are provided on both surfaces of the core member 2. However, a plurality of buildup layers including at least one inner buildup layer and an outer buildup layer may be provided only on one surface of the core member. Further, any number of inner buildup layers (not reinforced by glass fibers) may be disposed between the (or each) outer buildup layer and the core member.

The preferred embodiment of the present invention being thus described, it is obvious that the same may be varied in many way. Such variations should not be regarded as a departure from the spirit and scope of the present invention, and all such variations of the present invention as would be obvious to those skilled in the art are intended to be covered by the scope of the appended claims.

What is claimed is:

1. A multilayer printed circuit board comprising:

a base member provided with a base wiring pattern formed on at least one surface thereof;

at least one inner insulating buildup layer laminated on said at least one surface of the base member and having a surface formed with an inner buildup wiring pattern, the inner buildup wiring pattern being electrically connected to the base wiring pattern through at least one via formed in said at least one inner buildup layer; and an outermost insulating buildup layer laminated on said surface of said at least one inner buildup layer and having a surface formed with an outermost buildup wiring pattern, the outermost buildup wiring pattern being electrically connected to the inner wiring pattern through at least one via formed in the outermost buildup layer;

wherein said at least one inner buildup layer is made of a resin material which is not reinforced by glass fibers, only the outermost buildup layer being made of a resin material reinforced by glass fibers.

2. The multilayer printed circuit board according to claim 1, wherein the glass fibers comprise an open glass fiber cloth.

3. The multilayer printed circuit board according to claim 1, wherein said at least one via of said at least one inner buildup layer comprises a filled via.

4. The multilayer printed circuit board according to claim 1, wherein said at least one via of the outer buildup layer comprises a filled via.

5. The multilayer printed circuit board according to claim 1, wherein said at least one via of said at least one inner buildup layer comprises a filled via, said at least one via of the outer buildup layer also comprising a filled via which is stacked on the filled via of said at least one inner buildup layer.

6. The multilayer printed circuit board according to claim 1, wherein the base member has another surface formed with an additional base wiring pattern, said at least one via of said at least one inner buildup layer comprising a skip via penetrating through said at least one inner buildup layer and the base member into electrical connection with the additional base wiring pattern.

7. The multilayer printed circuit board according to claim 1, further comprising:

an additional base wiring pattern formed on another surface of the base member;

at least one additional inner buildup layer laminated on said another surface of the base member and having a surface formed with an additional inner buildup wiring pattern, the additional inner buildup wiring pattern being electrically connected to the additional base wiring pattern through at least one via formed in said at least one additional inner buildup layer; and an additional outer buildup layer laminated on said surface of said at least one additional inner buildup layer and having a surface formed with an additional outer buildup wiring pattern, the additional outer buildup wiring pattern being electrically connected to the additional inner wiring pattern through at least one via formed in the additional outer buildup layer;

wherein said at least one additional inner buildup layer is made of a resin material which is not reinforced by glass fibers, the additional outer buildup layer being made of a resin material reinforced by glass fibers.

* * * * *